Dec. 20, 1960 J. D. PETERSON 2,964,831

ASSEMBLY PROCESS FOR SEMICONDUCTOR DEVICE

Filed July 25, 1958

INVENTOR

John D. Peterson

BY

Stevens, Davis, Miller & Mosher

ATTORNEYS 2,964,831

ASSEMBLY PROCESS FOR SEMICONDUCTOR DEVICE

John Daniel Peterson, Richardson, Tex., assignor to Texas Instruments Incorporated, Dallas, Tex., a corporation of Delaware Filed July 25, 1958, Ser. No. 750,900

4 Claims. (Cl. 29—25.3)

Figures 1, 2, 3, 4, 5, 6:
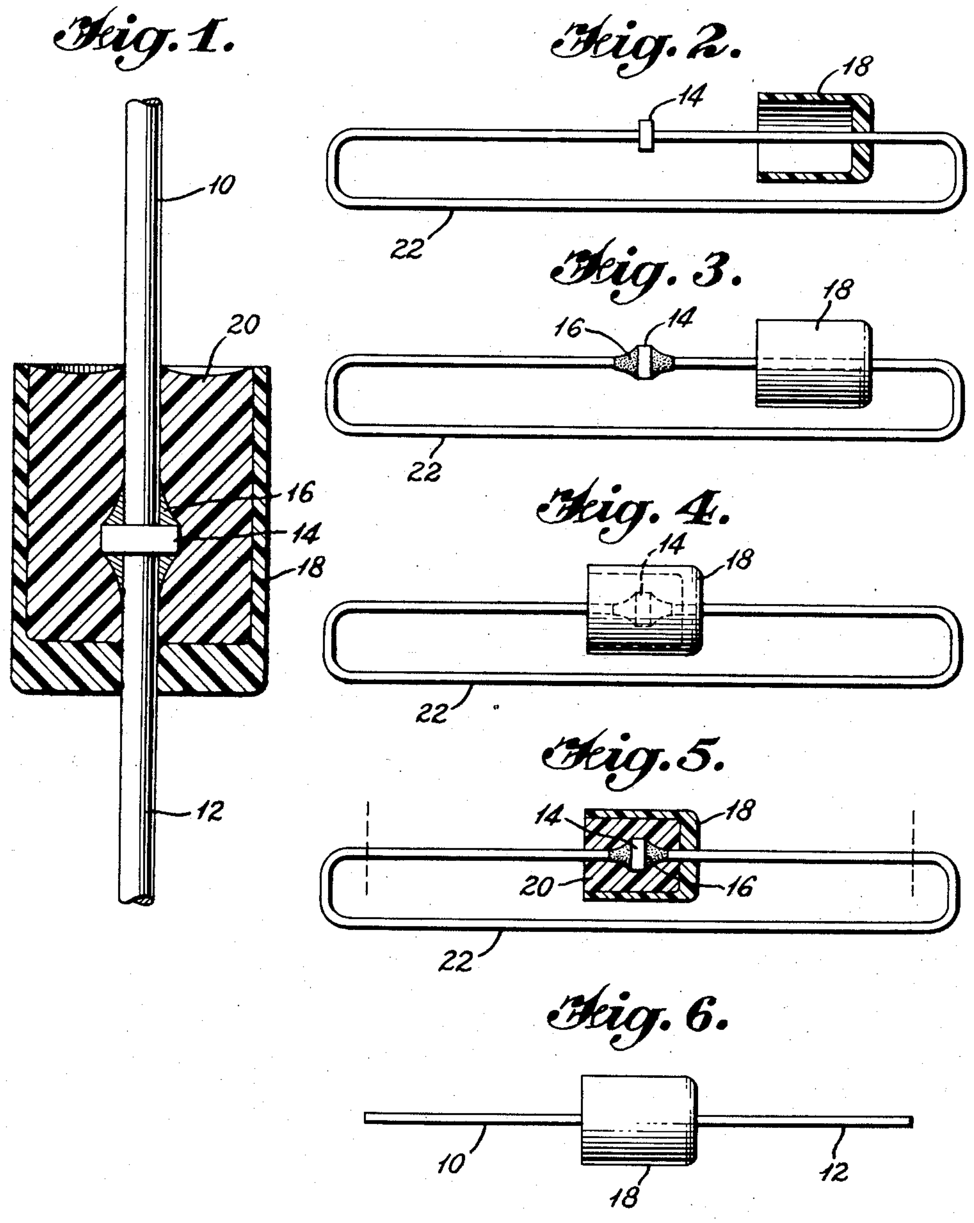

This invention relates to silicon diodes and more particularly to a method of fabricating such devices.

Silicon diodes of the type to which this invention pertains comprise, in general, a silicon wafer soldered between a pair of wire ends and encapsulated in a suitable resin. Due to the size of the parts and the difficulty in handling, the assembly of such diodes has been a relatively expensive and difficult job.

It is therefore an object of the present invention to facilitate the fabrication of such devices.

A further object of the present invention is to provide a simple method of assembling diffused silicon diodes.

Other objects and the nature and advantages of the invention will be apparent from the following description taken in conjunction with the accompanying drawings, wherein:

Fig. 1 is a cross-sectional view of a silicon diode manufactured in accordance with the present invention, and Figs. 2–6 are diagrammatic views showing the successive steps in the fabrication of the diode.

Referring now to the drawing, there is illustrated in Fig. 1 a silicon diode manufactured in accordance with the method of the present invention. The lead-in wires 10 and 12 are shown to be soldered to a nickel plated diffused silicon wafer 14 with solder 16. The soldered joint is enclosed by a case 18 through the base of which the wire 12 passes. The case 18 is filled with a rigid thermosetting resin 20 in which the device is embedded. As shown, the wires 10 and 12 form an in line wire configuration.

This diode may be simply made by the following method. A wire form or loop 22 is bent into rectangular shape from a piece of wire as shown in Fig. 2 with the open ends meeting mid-way of the upper longer side of the rectangle. This wire form or loop may be produced in quantity on a conventional wire forming machine. The wire ends are essentially flat and in line. The wire is preferably a tinned copper or silver wire suitable for the lead wires of the completed device. The wire form is so made that the ends of the wire are under a compressive load and act to spring together.

The case 18, which is preferably made of nylon, is assembled onto the wire form and is moved to a position away from the meeting ends of the wire. The silicon wafer 14 is then placed between the wire ends and is retained therein by the compressive load of the wire. The assembly at this stage is self-supporting and needs no holding device to maintain the assembly through the succeeding steps of the method. By simply hanging a quantity of assemblies on a suitable rack the next series of operations can be accomplished in multiple.

The assembly is now ready for soldering the wafer to the two wire ends. This may be accomplished by dipping the assembly in a suitable flux, then into solder followed by washing to remove the flux. The assembly is then etched, washed and baked.

At this point, the nylon case is moved into position over the wafer and the device is embedded in a resin and cured. The resin is preferably an epoxy resin.

After the resin has cured, the wire loop is cut in two places, shown in dotted lines in Fig. 5, just inside the bends to yield the finished product.

The method of retaining the wafer between the ends of a wire loop to retain it therein during the subsequent soldering operation has other applications than in silicon diode manufacture.

As a specific example of operation, a silicon diode was made as follows. The wire loop was made of No. 20 tinned copper wire in the form of a rectangle, having rounded corners the length of which was approximately 3" and the height, less than ½". The ends of the wire were flat surfaces along most of their meeting edges, and were in line with one another. The diode case for encapsulating the device was made by molding from nylon. The diode case is cup-shaped having one open end and one closed end. The closed end is provided with a tapered hole in the center thereof adapted to permit the wire to pass therethrough. The diode case was then assembled onto the wire form by springing the wire ends apart and inserting one end of the wire through the hole in the case, and sliding the case along the wire. The silicon wafer was next inserted between the wire ends, being held therebetween by the compressive load of the wire. The assembly is self-supporting and is illustrated in Fig. 2. The silicon wafer was made by conventional gaseous diffusion techniques to yield a material with suitable electrical characteristics.

The assembly is next dipped in a suitable soldering flux and then into a suitable solder followed by washing. The soldered joint is shown in Fig. 3. The soldered joint is given a 15 second etch in a phosphate solution, followed by a 5 second etch in a 50% nitric acid solution, a cleaning and finally a baking step. The diode case is then moved to the position shown in Fig. 4 covering the soldered joint, whereupon the case is potted with an epoxy resin and cured as shown in Fig. 5. The wire loop is next cut along the dotted lines of Fig. 5 to give the finished product as shown in Fig. 6.

This simple method of assembly may be employed in mass production by hanging quantities of the sub-assemblies shown in Fig. 2 on suitable racks so that the subsequent operations can be performed in multiple.

It will be obvious to those skilled in the art that various changes may be made without departing from the spirit of the invention and therefore the invention is not limited to what is shown in the drawings and described in the specification, but only as indicated in the appended claims.

What is claimed is:

1. The process of making a silicon diode which comprises bending a conductor wire into a loop form with the ends in alignment and under compression, inserting a cup-shaped diode case having an opening in the bottom wall onto one end of said wire with the wire extending through said opening, inserting a diffused silicon wafer between the ends of said wire, said wafer being held therebetween by the compression of the wire ends, soldering the wafer to said wire ends, cleaning the soldered joint, moving said case along said wire to enclose the soldered joint, potting and curing the joint in the case, and cutting the wire loop to yield the completed diode.

2. In the process of claim 1 in which the wire loop is in the form of a rectangle with the ends meeting at the center of one of the longer sides, and wherein the wire is cut at each end of the said longer side to yield an in line diode.

3. The method of making semiconductor devices comprising bending a conductor wire having end surfaces cut perpendicular to the axis of the wire into a loop form with the ends of the wire in axial alignment and under compression, inserting a cup-shaped case having an opening in the bottom end with the wire extending through said opening, inserting a semiconductor wafer between the ends of the wire, attaching the wafer to said ends of said wire, positioning said case to surround said wafer, encapsulating said wafer within said case, and cutting said wire to yield the completed device.

4. The method of making semiconductor devices comprising bending a conductor wire having end surfaces cut perpendicular to the axis of the wire into a loop form with the ends of the wire in axial alignment and under compression, inserting a semiconductor wafer between the ends of the wire, attaching the wafer to said ends of said wire, covering said wafer with a protective material, and cutting said wire to yield the completed device.

References Cited in the file of this patent

UNITED STATES PATENTS 2,321,071 Ehrhardt et al. ------------ June 8, 1943